(12) United States Patent
Darveaux et al.

(10) Patent No.: US 8,482,134 B1
(45) Date of Patent: Jul. 9, 2013

(54) STACKABLE PACKAGE AND METHOD

(75) Inventors: Robert Francis Darveaux, Gilbert, AZ (US); Roger D. St. Amand, Tempe, AZ (US); Vladimir Perelman, Fremont, CA (US)

(73) Assignee: Amkor Technology, Inc., Chandler, AZ (US)

( * ) Notice: Subject to any disclaimer, the term of this patent is extended or adjusted under 35 U.S.C. 154(b) by 186 days.

(21) Appl. No.: 12/917,185

(22) Filed: Nov. 1, 2010

(51) Int. Cl.
*H01L 23/488* (2006.01)

(52) U.S. Cl.
USPC ........... 257/780; 257/686; 257/707; 257/778; 257/E23.021; 257/E23.069

(58) Field of Classification Search
USPC .................................. 257/778, 779, 780, 786
See application file for complete search history.

(56) References Cited

U.S. PATENT DOCUMENTS

| | | | |
|---|---|---|---|
| 3,868,724 A | 2/1975 | Perrino | |
| 3,916,434 A | 10/1975 | Garboushian | |
| 4,322,778 A | 3/1982 | Barbour et al. | |
| 4,532,419 A | 7/1985 | Takeda | |
| 4,642,160 A | 2/1987 | Burgess | |
| 4,645,552 A | 2/1987 | Vitriol et al. | |
| 4,685,033 A | 8/1987 | Inoue | |
| 4,706,167 A | 11/1987 | Sullivan | |
| 4,716,049 A | 12/1987 | Patraw | |
| 4,786,952 A | 11/1988 | MacIver et al. | |
| 4,806,188 A | 2/1989 | Rellick | |
| 4,811,082 A | 3/1989 | Jacobs et al. | |
| 4,897,338 A | 1/1990 | Spicciati et al. | |
| 4,905,124 A | 2/1990 | Banjo et al. | |
| 4,964,212 A | 10/1990 | Deroux-Dauphin et al. | |
| 4,974,120 A | 11/1990 | Kodai et al. | |
| 4,996,391 A | 2/1991 | Schmidt | |
| 5,021,047 A | 6/1991 | Movern | |
| 5,072,075 A | 12/1991 | Lee et al. | |

(Continued)

FOREIGN PATENT DOCUMENTS

| | | |
|---|---|---|
| JP | 05-109975 | 4/1993 |
| JP | 05-136323 | 6/1993 |

(Continued)

OTHER PUBLICATIONS

IBM Technical Disclosure Bulletin, "Microstructure Solder Mask by Means of a Laser", vol. 36, Issue 11, p. 589, Nov. 1, 1993.

(Continued)

*Primary Examiner* — Calvin Lee
*Assistant Examiner* — Abul Kalam
(74) *Attorney, Agent, or Firm* — McKay and Hodgson, LLP; Serge J. Hodgson

(57) ABSTRACT

A stackable package is placed within a mold during an encapsulation operation. A compliant surface, e.g., of a compliant film, of the mold is pressed down on upper interconnection balls of the stackable package to force upper portions of the upper interconnection balls into the mold. However, lower portions of the upper interconnection balls are exposed within a space between the compliant surface and a substrate of the stackable package. The space is filled with a dielectric material to form a package body. The package body is formed while at the same time exposing the upper portions of upper interconnection balls from the package body in a single encapsulation operation. By avoiding selective removal of the package body to expose the upper interconnection balls, the number of operations as well as cost to manufacture the stackable package is minimized.

4 Claims, 18 Drawing Sheets

U.S. PATENT DOCUMENTS

| | | |
|---|---|---|
| 5,072,520 A | 12/1991 | Nelson |
| 5,081,520 A | 1/1992 | Yoshii et al. |
| 5,091,769 A | 2/1992 | Eichelberger |
| 5,108,553 A | 4/1992 | Foster et al. |
| 5,110,664 A | 5/1992 | Nakanishi et al. |
| 5,191,174 A | 3/1993 | Chang et al. |
| 5,229,550 A | 7/1993 | Bindra et al. |
| 5,239,448 A | 8/1993 | Perkins et al. |
| 5,247,429 A | 9/1993 | Iwase et al. |
| 5,250,843 A | 10/1993 | Eichelberger |
| 5,278,726 A | 1/1994 | Bernardoni et al. |
| 5,283,459 A | 2/1994 | Hirano et al. |
| 5,353,498 A | 10/1994 | Fillion et al. |
| 5,371,654 A | 12/1994 | Beaman et al. |
| 5,379,191 A | 1/1995 | Carey et al. |
| 5,404,044 A | 4/1995 | Booth et al. |
| 5,463,253 A | 10/1995 | Waki et al. |
| 5,474,957 A | 12/1995 | Urushima |
| 5,474,958 A | 12/1995 | Djennas et al. |
| 5,497,033 A | 3/1996 | Fillion et al. |
| 5,508,938 A | 4/1996 | Wheeler |
| 5,530,288 A | 6/1996 | Stone |
| 5,531,020 A | 7/1996 | Durand et al. |
| 5,546,654 A | 8/1996 | Wojnarowski et al. |
| 5,574,309 A | 11/1996 | Papapietro et al. |
| 5,578,934 A | 11/1996 | Wood et al. |
| 5,581,498 A | 12/1996 | Ludwig et al. |
| 5,582,858 A | 12/1996 | Adamopoulos et al. |
| 5,616,422 A | 4/1997 | Ballard et al. |
| 5,637,832 A | 6/1997 | Danner |
| 5,674,785 A | 10/1997 | Akram et al. |
| 5,719,749 A | 2/1998 | Stopperan |
| 5,721,496 A | 2/1998 | Farnworth et al. |
| 5,726,493 A | 3/1998 | Yamashita et al. |
| 5,739,581 A | 4/1998 | Chillara |
| 5,739,585 A | 4/1998 | Akram et al. |
| 5,739,588 A | 4/1998 | Ishida et al. |
| 5,742,479 A | 4/1998 | Asakura |
| 5,774,340 A | 6/1998 | Chang et al. |
| 5,784,259 A | 7/1998 | Asakura |
| 5,798,014 A | 8/1998 | Weber |
| 5,822,190 A | 10/1998 | Iwasaki |
| 5,826,330 A | 10/1998 | Isoda et al. |
| 5,835,355 A | 11/1998 | Dordi |
| 5,847,453 A | 12/1998 | Uematsu et al. |
| 5,883,425 A | 3/1999 | Kobayashi |
| 5,894,108 A | 4/1999 | Mostafazadeh et al. |
| 5,903,052 A | 5/1999 | Chen et al. |
| 5,907,477 A | 5/1999 | Tuttle et al. |
| 5,915,977 A | 6/1999 | Hembree et al. |
| 5,924,003 A | 7/1999 | Slocum |
| 5,936,843 A | 8/1999 | Ohshima et al. |
| 5,952,611 A | 9/1999 | Eng et al. |
| 6,004,619 A | 12/1999 | Dippon et al. |
| 6,013,948 A | 1/2000 | Akram et al. |
| 6,021,564 A | 2/2000 | Hanson |
| 6,028,364 A | 2/2000 | Ogino et al. |
| 6,034,427 A | 3/2000 | Lan et al. |
| 6,035,527 A | 3/2000 | Tamm |
| 6,040,239 A | 3/2000 | Akram et al. |
| 6,040,622 A | 3/2000 | Wallace |
| 6,060,778 A | 5/2000 | Jeong et al. |
| 6,069,407 A | 5/2000 | Hamzehdoost |
| 6,072,243 A | 6/2000 | Nakanishi |
| 6,081,036 A | 6/2000 | Hirano et al. |
| 6,119,338 A | 9/2000 | Wang et al. |
| 6,122,171 A | 9/2000 | Akram et al. |
| 6,127,833 A | 10/2000 | Wu et al. |
| 6,160,705 A | 12/2000 | Stearns et al. |
| 6,172,419 B1 | 1/2001 | Kinsman |
| 6,175,087 B1 | 1/2001 | Keesler et al. |
| 6,184,463 B1 | 2/2001 | Panchou et al. |
| 6,194,250 B1 | 2/2001 | Melton et al. |
| 6,204,453 B1 | 3/2001 | Fallon et al. |
| 6,214,641 B1 | 4/2001 | Akram |
| 6,235,554 B1 | 5/2001 | Akram et al. |
| 6,239,485 B1 | 5/2001 | Peters et al. |
| 6,252,298 B1 * | 6/2001 | Lee et al. ............... 257/668 |
| D445,096 S | 7/2001 | Wallace |
| D446,525 S | 8/2001 | Okamoto et al. |
| 6,274,821 B1 | 8/2001 | Echigo et al. |
| 6,280,641 B1 | 8/2001 | Gaku et al. |
| 6,316,285 B1 | 11/2001 | Jiang et al. |
| 6,351,031 B1 | 2/2002 | Iijima et al. |
| 6,353,999 B1 | 3/2002 | Cheng |
| 6,365,975 B1 | 4/2002 | DiStefano et al. |
| 6,376,906 B1 | 4/2002 | Asai et al. |
| 6,392,160 B1 | 5/2002 | Andry et al. |
| 6,395,578 B1 | 5/2002 | Shin et al. |
| 6,405,431 B1 | 6/2002 | Shin et al. |
| 6,406,942 B2 | 6/2002 | Honda |
| 6,407,341 B1 | 6/2002 | Anstrom et al. |
| 6,407,930 B1 | 6/2002 | Hsu |
| 6,448,510 B1 | 9/2002 | Neftin et al. |
| 6,451,509 B2 | 9/2002 | Keesler et al. |
| 6,462,274 B1 * | 10/2002 | Shim et al. ............... 174/535 |
| 6,479,762 B2 | 11/2002 | Kusaka |
| 6,489,667 B1 * | 12/2002 | Shim et al. ............... 257/668 |
| 6,497,943 B1 | 12/2002 | Jimarez et al. |
| 6,517,995 B1 | 2/2003 | Jacobson et al. |
| 6,534,391 B1 | 3/2003 | Huemoeller et al. |
| 6,544,461 B1 | 4/2003 | Hembree et al. |
| 6,544,638 B2 | 4/2003 | Fischer et al. |
| 6,586,682 B2 | 7/2003 | Strandberg |
| 6,608,757 B1 | 8/2003 | Bhatt et al. |
| 6,660,559 B1 | 12/2003 | Huemoeller et al. |
| 6,715,204 B1 | 4/2004 | Tsukada et al. |
| 6,727,645 B2 | 4/2004 | Tsujimura et al. |
| 6,730,857 B2 | 5/2004 | Konrad et al. |
| 6,734,542 B2 | 5/2004 | Nakatani et al. |
| 6,740,964 B2 | 5/2004 | Sasaki |
| 6,753,612 B2 | 6/2004 | Adae-Amoakoh et al. |
| 6,774,748 B1 | 8/2004 | Ito et al. |
| 6,787,443 B1 | 9/2004 | Boggs et al. |
| 6,803,528 B1 | 10/2004 | Koyanagi |
| 6,815,709 B2 | 11/2004 | Clothier et al. |
| 6,815,739 B2 | 11/2004 | Huff et al. |
| 6,838,776 B2 | 1/2005 | Leal et al. |
| 6,888,240 B2 | 5/2005 | Towle et al. |
| 6,919,514 B2 | 7/2005 | Konrad et al. |
| 6,921,968 B2 | 7/2005 | Chung |
| 6,921,975 B2 | 7/2005 | Leal et al. |
| 6,931,726 B2 | 8/2005 | Boyko et al. |
| 6,936,922 B1 * | 8/2005 | Park et al. ............... 257/737 |
| 6,953,995 B2 | 10/2005 | Farnworth et al. |
| 6,987,314 B1 | 1/2006 | Yoshida et al. |
| 7,015,075 B2 | 3/2006 | Fay et al. |
| 7,030,469 B2 | 4/2006 | Mahadevan et al. |
| 7,081,661 B2 | 7/2006 | Takehara et al. |
| 7,125,744 B2 | 10/2006 | Takehara et al. |
| 7,129,113 B1 | 10/2006 | Lin et al. |
| 7,185,426 B1 | 3/2007 | Hiner et al. |
| 7,198,980 B2 | 4/2007 | Jiang et al. |
| 7,242,081 B1 | 7/2007 | Lee |
| 7,282,394 B2 | 10/2007 | Cho et al. |
| 7,285,855 B2 | 10/2007 | Foong |
| 7,345,361 B2 | 3/2008 | Mallik et al. |
| 7,372,151 B1 | 5/2008 | Fan et al. |
| 7,429,786 B2 | 9/2008 | Karnezos et al. |
| 7,459,202 B2 | 12/2008 | Magera et al. |
| 7,548,430 B1 | 6/2009 | Huemoeller et al. |
| 7,550,857 B1 | 6/2009 | Longo et al. |
| 7,633,765 B1 | 12/2009 | Scanlan et al. |
| 7,667,338 B2 * | 2/2010 | Lin et al. ............... 257/787 |
| 7,671,457 B1 | 3/2010 | Hiner et al. |
| 7,777,351 B1 | 8/2010 | Berry et al. |
| 7,825,520 B1 | 11/2010 | Longo et al. |
| 8,183,696 B2 * | 5/2012 | Meyer et al. ............... 257/774 |
| 8,300,423 B1 * | 10/2012 | Darveaux et al. ............... 361/772 |
| 2002/0017712 A1 | 2/2002 | Bessho et al. |
| 2002/0061642 A1 | 5/2002 | Haji et al. |
| 2002/0066952 A1 | 6/2002 | Taniguchi et al. |

| | | | |
|---|---|---|---|
| 2002/0195697 A1 | 12/2002 | Mess et al. | |
| 2003/0025199 A1 | 2/2003 | Wu et al. | |
| 2003/0128096 A1 | 7/2003 | Mazzochette | |
| 2003/0141582 A1 | 7/2003 | Yang et al. | |
| 2003/0146519 A1* | 8/2003 | Huang | 257/778 |
| 2003/0197284 A1 | 10/2003 | Khiang et al. | |
| 2004/0036164 A1* | 2/2004 | Koike et al. | 257/723 |
| 2004/0063246 A1 | 4/2004 | Karnezos | |
| 2004/0145044 A1 | 7/2004 | Sugaya et al. | |
| 2004/0159462 A1 | 8/2004 | Chung | |
| 2005/0139985 A1 | 6/2005 | Takahashi | |
| 2005/0242425 A1 | 11/2005 | Leal et al. | |
| 2006/0208041 A1* | 9/2006 | MacKay et al. | 228/254 |
| 2007/0273049 A1 | 11/2007 | Khan et al. | |
| 2007/0281471 A1 | 12/2007 | Hurwitz et al. | |
| 2007/0290376 A1 | 12/2007 | Zhao et al. | |
| 2008/0116557 A1* | 5/2008 | Paek et al. | 257/686 |
| 2008/0230887 A1 | 9/2008 | Sun et al. | |
| 2009/0115045 A1* | 5/2009 | Hsu et al. | 257/686 |
| 2009/0146282 A1* | 6/2009 | Tay et al. | 257/686 |

FOREIGN PATENT DOCUMENTS

| | | |
|---|---|---|
| JP | 07-017175 | 1/1995 |
| JP | 08-190615 | 7/1996 |
| JP | 10-334205 | 12/1998 |

OTHER PUBLICATIONS

Kim et al., "Application of Through Mold Via (TMV) as PoP base package", 58th ECTC Proceedings, May 2008, Lake Buena Vista, FL, 6 pages, IEEE.

Scanlan, "Package-on-package (PoP) with Through-mold Vias", Advanced Packaging, Jan. 2008, 3 pages, vol. 17, Issue 1, PennWell Corporation.

Hiner et al., "Printed Wiring Motherboard Having Bonded Interconnect Redistribution Mesa", U.S. Appl. No. 10/992,371, filed Nov. 18, 2004.

Huemoeller et al., "Build Up Motherboard Fabrication Method and Structure", U.S. Appl. No. 11/824,395, filed Jun. 29, 2007.

Huemoeller et al., "Buildup Dielectric Layer Having Metallization Pattern Semiconductor Package Fabrication Method", U.S. Appl. No. 12/387,691, filed May 5, 2009.

Miller, Jr. et al., "Thermal Via Heat Spreader Package and Method", U.S. Appl. No. 12/421,118, filed Apr. 9, 2009.

Darveaux et al., "Stackable Treated Via Package and Method", U.S. Appl. No. 12/787,238, filed May 25, 2010.

Kim et al., "Semiconductor Device and Fabricating Method Thereof", U.S. Appl. No. 12/943,540, filed Nov. 10, 2010.

* cited by examiner

STACKABLE PACKAGE AND METHOD

TECHNICAL FIELD

The present application relates to the field of electronics, and more particularly, to methods of forming electronic component packages and related structures.

BACKGROUND

To form a lower electronic component package for use in a stacked electronic component assembly, electrically conductive vias are initially completely enclosed within an encapsulant. The encapsulant is then selectively removed to expose the electrically conductive vias. However, selectively removing the encapsulant to expose the electrically conductive vias is a relatively complex and costly operation.

BRIEF DESCRIPTION OF THE DRAWINGS

In the following description, the same or similar elements are labeled with the same or similar reference numbers.

DETAILED DESCRIPTION

Figure 3:
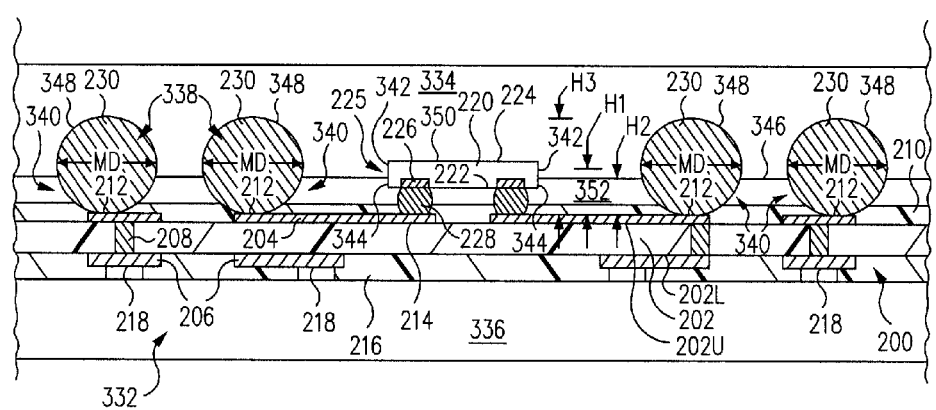
FIG. 3 is a cross-sectional view of the stackable package of FIG. 2 within a mold during encapsulation in accordance with one embodiment.

As an overview and in accordance with one embodiment, referring to FIG. 3, a stackable package 200 is placed within a mold 332 during an encapsulation operation. A compliant surface 346, e.g., of a compliant film, of mold 332 is pressed down on upper interconnection balls 230 to create interconnection ball cavities 348 in compliant surface 346. Interconnection ball cavities 348 are self-aligned with upper interconnection balls 230.

More particularly, upper portions 338 of upper interconnection balls 230 are located within and enclosed by interconnection ball cavities 348. However, lower portions 340 of upper interconnection balls 230 are exposed within a space 352 between compliant surface 346 and substrate 202.

Figure 4:
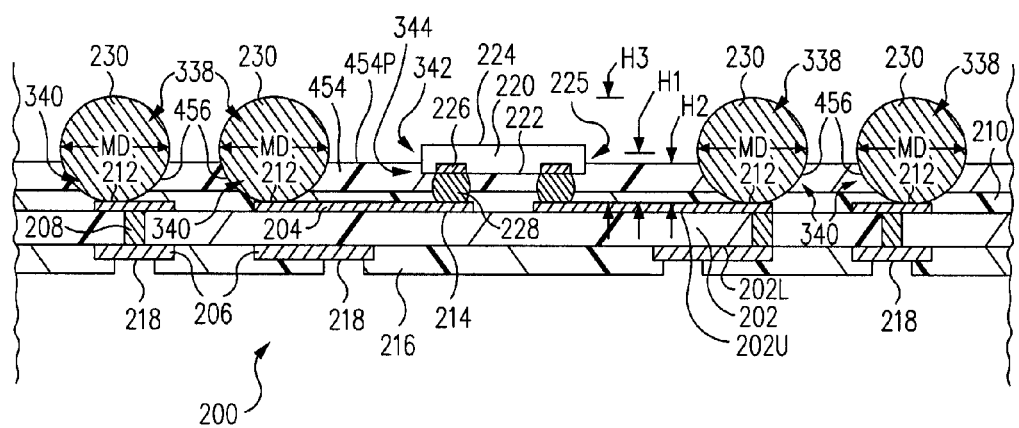
FIG. 4 is a cross-sectional view of the stackable package of FIG. 2 after encapsulation in accordance with one embodiment.

Referring now to FIGS. 3 and 4 together, space 352 (FIG. 3) is filled with a dielectric material to form a package body 454 as illustrated in FIG. 4. Package body 454 is formed while at the same time exposing upper portions 338 of upper interconnection balls 230 in a single encapsulation operation. By avoiding selective removal of package body 454 to expose upper interconnection balls 230, the number of operations as well as cost to manufacture stackable package 200 is minimized.

Further, by having 50% or more of upper interconnection balls 230 exposed from package body 454, reliable reflow, i.e., heating to a melt and resolidifying, of upper interconnection balls 230 is insured. More particularly, upper interconnection balls 230 are located within pockets 456 in package body 454. Pockets 456 increase in width from upper surface 202U of substrate 202 to have a maximum width at a principal surface 454P of package body 454.

Accordingly, during reflow, gases released from upper interconnection balls 230 are reliably vented from, and not trapped within, pockets 456. Further, by having 50% or more of upper interconnection balls 230 exposed from package body 454, there is enough exposed material of upper interconnection balls 230 to insure formation of reliable solder joints from upper interconnection balls 230.

Figure 1:
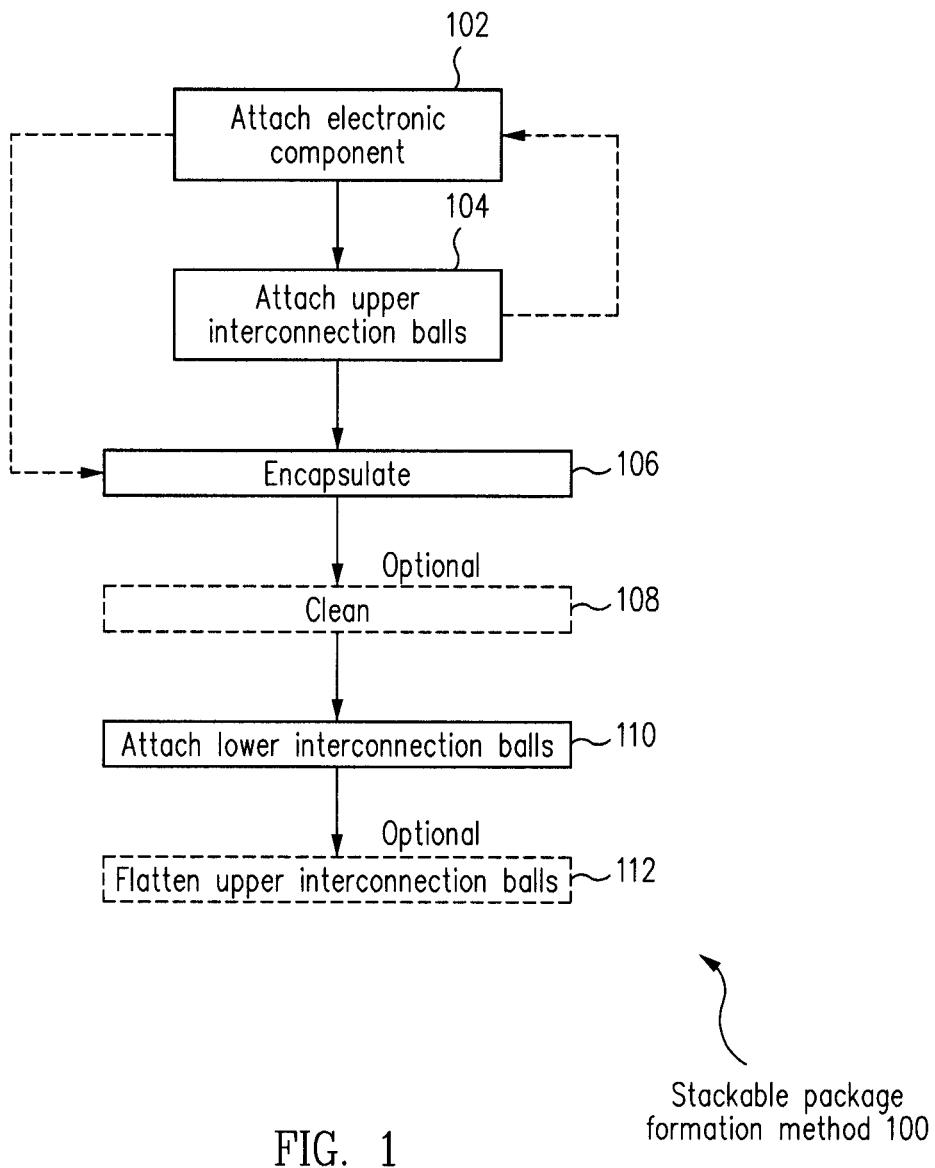
FIG. 1 is a block diagram of a stackable package formation method in accordance with one embodiment.
Figure 2:
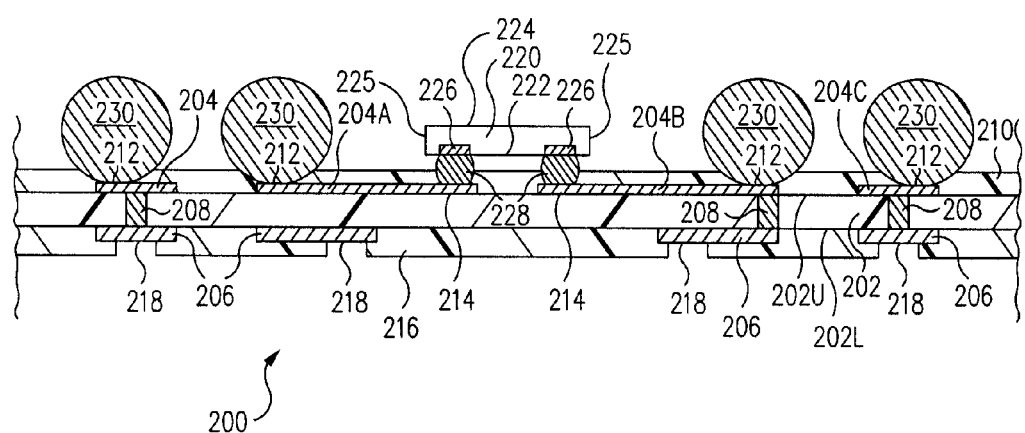
FIG. 2 is a cross-sectional view of a stackable package during fabrication in accordance with one embodiment.

Now in more detail, FIG. 1 is a block diagram of a stackable package formation method 100 in accordance with one embodiment. FIG. 2 is a cross-sectional view of a stackable package 200 during fabrication in accordance with one embodiment. Paying particular attention to FIG. 2, stackable package 200, sometimes called an electronic component package, includes a substrate 202 including an upper, e.g., first, surface 202U and an opposite lower, e.g., second, surface 202L. Substrate 202 is a dielectric material such as laminate, ceramic, printed circuit board material, or other dielectric material.

Formed on upper surface 202U of substrate 202 are electrically conductive upper, e.g., first, traces 204, e.g., formed of copper. Formed on lower surface 202L of substrate 202 are lower, e.g., second, traces 206. Lower traces 206 are electrically connected to upper traces 204 by electrically conductive vias 208 extending through substrate 202 between upper surface 202U and lower surface 202L.

Stackable package 200 further includes an upper, e.g., first, solder mask 210 on upper surface 202U that protects first portions of upper traces 204 while exposing second portions, e.g., terminals 212 and/or bond fingers 214, of upper traces 204.

Stackable package 200 further includes a lower, e.g., second, solder mask 216 on lower surface 202L that protects first portions of lower traces 206 while exposing second portions, e.g., terminals 218, of lower traces 206.

Referring now to FIGS. 1 and 2 together, in an attach electronic component operation 102, an electronic component 220 is attached to substrate 202. In one embodiment, electronic component 220 is an integrated circuit chip, e.g., an active component. However, in other embodiments, electronic component 220 is a passive component such as a capacitor, resistor, or inductor. In another embodiment, electronic component 220 is a pre-packaged device. In yet another embodiment, a plurality of electronic components are mounted, e.g., in a stacked configuration.

In accordance with this embodiment, electronic component 220 includes an active surface 222, an opposite inactive surface 224, and sides 225 extending perpendicularly between active surface 222 and inactive surface 224. Electronic component 220 further includes bond pads 226 formed on active surface 222.

In accordance with this embodiment, electronic component 220 is mounted in a flip chip configuration. More particularly, flip chip bumps 228, e.g., solder, form the physical and electrical connections between bond pads 226 and upper traces 204, e.g., bond fingers 214 thereof.

From attach electronic component operation 102, flow moves to an attach upper interconnection balls operation 104. In attach upper interconnection balls operation 104, electrically conductive upper, e.g., first, interconnection balls 230 are attached to terminals 212 of upper traces 204 and more generally to substrate 202.

Illustratively, upper interconnection balls 230 are formed of solder. In other embodiments, upper interconnection balls 230 are formed of other electrically conductive material such as plated copper or electrically conductive adhesive. Interconnection balls 230 are sometimes called interconnection structures. As illustrated, upper interconnection balls 230 are approximately spherical and the upper surfaces of upper interconnection balls 230 are thus sometime called convex surfaces.

Although a particular electrically conductive pathway between bond pads 226 and lower traces 206 is described above, other electrically conductive pathways can be formed. For example, contact metallizations can be formed between the various electrical conductors.

Further, instead of straight though vias 208, in one embodiment, substrate 202 is a multilayer substrate and a plurality of vias and/or internal traces form the electrical interconnection between upper traces 204 and lower traces 206.

In accordance with one embodiment, one or more of upper traces 204 is not electrically connected to lower traces 206, i.e., is electrically isolated from lower traces 206, and electrically connected to bond pads 226. To illustrate, a first upper trace 204A of the plurality of upper traces 204 is electrically isolated from lower traces 206 and electrically connected to a respective bond pad 226. In accordance with this embodiment, the respective bond pad 226 electrically connected to upper trace 204A is also electrically isolated from lower traces 206.

In accordance with one embodiment, one or more of upper traces 204 is electrically connected to both bond pads 226 and to lower traces 206. To illustrate, a second upper trace 204B of the plurality of upper traces 204 is electrically connected to lower trace(s) 206 by a via 208. In accordance with this embodiment, the respective bond pad 226 electrically connected to upper trace 204B is also electrically connected to lower trace(s) 206.

In accordance with one embodiment, one or more of upper traces 204 is not electrically connected to a bond pad 226, i.e., is electrically isolated from bond pads 226, and is electrically connected to lower traces 206. To illustrate, a third upper trace 204C is electrically isolated from bond pads 226 and electrically connected to lower trace(s) 206. In accordance with this embodiment, the respective lower trace(s) 206 electrically connected to upper trace 204C are also electrically isolated from bond pads 226.

As set forth above, in accordance with various embodiments, upper traces 204 are electrically connected to lower traces 206, to bond pads 226, and/or to lower traces 206 and bond pads 226. Thus, in accordance with various embodiments, upper interconnection balls 230 are electrically connected to lower traces 206 only, to bond pads 226 only, and/or to both lower traces 206 and bond pads 226.

Although various examples of connections between bond pads 226, upper traces 204, lower traces 206, and upper interconnection balls 230 are set forth above, in light of this disclosure, those of skill in the art will understand that any one of a number of electrical configurations are possible depending upon the particular application.

As set forth above, attach electronic component operation 102 is performed prior to attach upper interconnection balls operation 104 in one embodiment. Accordingly, electronic component 220 is flip chip mounted with flip chip bumps 228 first and then upper interconnection balls 230 are attached to terminals 212.

In another embodiment, as indicated by the dashed arrows in FIG. 1, attach upper interconnection balls operation 104 is performed prior to attach electronic component operation 102. Accordingly, upper interconnection balls 230 are attached to terminals 212 first and then electronic component 220 is flip chip mounted with flip chip bumps 228.

In yet another embodiment, attach electronic component operation 102 is performed simultaneously with attach upper interconnection balls operation 104. Accordingly, upper interconnection balls 230 are attached to terminals 212 and electronic component 220 is flip chip mounted with flip chip bumps 228 simultaneously, e.g., in a single reflow operation.

FIG. 3 is a cross-sectional view of stackable package 200 of FIG. 2 within a mold 332 during encapsulation in accordance with one embodiment. Referring now to FIGS. 1 and 3 together, from attach upper interconnection balls operation 104 (or optionally from attach electronic component operation 102 as indicated by the dashed arrow), flow moves to an encapsulate operation 106. In encapsulate operation 106, stackable package 200 is encapsulated.

More particularly, during encapsulate operation 106, stackable package 200 is placed within mold 332. Mold 332 includes an upper, e.g., first, mold half 334 and a lower, e.g., second, mold half 336. In light of this disclosure, those of skill in the art will understand that mold 332 can further include other components that are not illustrated or described to avoid detracting from the principals of this embodiment.

As illustrated, lower surface 202L of substrate 202 (lower solder mask 216) is supported by lower mold half 336. Upper mold half 334 encloses upper, e.g., first, portions 338 of upper interconnection balls 230 while exposing lower, e.g., second, portions 340 of upper interconnection balls 230. Further, upper mold half 334 encloses inactive surface 224 and upper, e.g., first, portions 342 of sides 225 of electronic component 220. Lower, e.g., second, portions 344 of sides 225 and active surface 222 of electronic component 220 are exposed from upper mold half 334.

More particularly, upper mold half 334 includes a lower compliant surface 346. Lower compliant surface 346 is compliant, sometimes called conformable, to upper interconnection balls 230 and electronic component 220. In one embodiment, upper mold half 334 includes a compliant film, sometimes called a soft insert, e.g., silicon, rubber, polymer, or other compliant material, that includes lower compliant surface 346. Accordingly, mold 332 is sometimes called a film assist mold.

In one embodiment, upper mold half 334 is pressed downward against upper interconnection balls 230 and electronic component 220. Due to this pressure, upper interconnection balls 230 and electronic component 220 indent into lower compliant surface 346 of upper mold half 334 thus forming interconnection ball cavities 348 and an electronic component cavity 350 in upper mold half 334. In this manner, lower compliant surface 346 seals upper interconnection balls 230 and electronic component 220.

Upper portions 338 of upper interconnection balls 230 are located within and enclosed by interconnection ball cavities 348, which are self-aligned with interconnection balls 230. More particularly, upper portions 338 are the portions of upper interconnection balls 230 located within and enclosed by upper mold half 334. Stated another way, upper portions 338 are the portions of upper interconnection balls 230 located above the plane defined by lower compliant surface 346.

However, lower portions 340 of upper interconnection balls 230 are not enclosed within upper mold half 334 but are exposed. More particularly, lower portions 340 are located between upper mold half 334 and upper solder mask 210. Stated another way, lower portions 340 are the portions of upper interconnection balls 230 located below the plane defined by lower compliant surface 346.

In one embodiment, lower portions 340 are portions of upper interconnection balls 230 below the maximum diameter MD of upper interconnection balls 230 in a plane parallel to upper surface 202U of substrate 202. Maximum diameter MD is the largest cross sectional area of an upper interconnection ball 230 in a plane parallel to upper surface 202U of substrate 202. Stated another way, maximum diameter MD is the greatest width of upper interconnection balls 230.

To illustrate, upper interconnection balls 230 have maximum diameter MD in a plane parallel to upper surface 202U of substrate 202 at a first height H1 from terminals 212 of upper traces 204. Lower compliant surface 346 is located at a second height H2 from terminals 212 of upper traces 204. Second height H2 of lower compliant surface 346 is less than first height H1 of maximum diameter MD of upper interconnection balls 230.

In one embodiment, upper interconnection balls 230 are spherical. Accordingly, height H1 is equal to maximum diameter MD divided by two, i.e., ½(maximum diameter MD). Further, as upper interconnection balls 230 are spherical, the total height H3 of upper interconnection balls 230 in a direction perpendicular to upper surface 202U of substrate 202 is equal to maximum diameter MD. Accordingly, height H1 is equal to fifty percent (50%) of the total height H3 of interconnection balls 230. Although the term spherical is used herein, it is to be understood that upper interconnection balls 230 may not be exactly spherical, but only substantially spherical to within excepted manufacturing tolerances. Further, in another embodiment, upper interconnection balls 230 are non-spherical. Generally, height H2 of lower compliant surface 346 is equal to 50% or less of the total height H3 of upper interconnection balls 230.

Lower compliant surface 346 and upper solder mask 210 define a space 352 therebetween. As illustrated, lower portions 340 of upper interconnection balls 230, lower portions 344 of sides 225 of electronic component 220, and flip chip bumps 228 are located within space 352.

FIG. 4 is a cross-sectional view of stackable package 200 of FIG. 2 after encapsulation in accordance with one embodiment. Referring now to FIGS. 1, 3, and 4 together, after stackable package 200 is placed within mold 332 as discussed above, space 352 is filled with a dielectric material to form a package body 454 as illustrated in FIG. 4. For example, space 352 is filled with an encapsulant or mold compound, which is then cured if necessary, e.g., cooled, to form package body 454. Stackable package 200 is then removed from mold 332 resulting in stackable package 200 as illustrated in FIG. 4.

As illustrated in FIG. 4, lower portions 340 of upper interconnection balls 230, lower portions 344 of sides 225 of electronic component 220, flip chip bumps 228, active surface 222, and upper solder mask 210, are enclosed, sometimes called encased, encapsulated, and/or covered, with package body 454. Package body 454 protects lower portions 340 of upper interconnection balls 230, lower portions 344 of sides 225 of electronic component 220, flip chip bumps 228, active surface 222, and upper solder mask 210 from the ambient environment, e.g., from contact, moisture and/or shorting to other structures. Generally, package body 454 encloses at least a portion of upper interconnection balls 230 and at least a portion of electronic component 220.

As the area between active surface 222 and upper solder mask 210 including flip chip bumps 228 is encapsulated by package body 454, stackable package 200 is sometimes called a molded underfill flip chip die package.

Package body 454 includes a principal surface 454P parallel to upper surface 202U of substrate 202. Although the terms parallel, perpendicular, and similar terms are used herein, it is to be understood that the described features may not be exactly parallel and perpendicular, but only substantially parallel and perpendicular to within excepted manufacturing tolerances.

Principal surface 454P is located at height H2 from terminals 212 of upper traces 204. As set forth above, height H2 is less than height H1 of maximum diameter MD of interconnection balls 230 from terminals 212 of upper traces 204 and also is less than or equal to fifty percent of the total height H3 of upper interconnection balls 230.

Accordingly, upper portions 338 of upper interconnection balls 230 project from principal surface 454P and generally from package body 454. Stated another way, upper portions 338 of upper interconnection balls 230 are exposed from package body 454. Upper interconnection balls 230 are sometimes called electrically conductive vias extending through package body 454 and are also sometimes called Through Mold Vias (TMV).

Package body 454 is formed while at the same time exposing upper portions 338 of upper interconnection balls 230 in a single encapsulate operation 106. By avoiding selective removal of package body 454 to expose upper interconnection balls 230, the number of operations as well as cost to manufacture stackable package 200 is minimized.

Further, by having maximum diameter MD of upper interconnection balls 230 exposed from package body 454, reliable reflow, i.e., heating to a melt and resolidifying, of upper interconnection balls 230 is insured. More particularly, upper interconnection balls 230 are located within pockets 456 in package body 454. Pockets 456 increase in width from substrate 202 to have a maximum width at principal surface 454P.

Accordingly, during reflow, gases released from upper interconnection balls 230 are reliably vented from, and not trapped within, pockets 456. Further, by having 50% or more of upper interconnection balls 230 exposed from package body 454, there is enough exposed material of upper interconnection balls 230 to insure formation of reliable solder columns, sometimes called solder joints, from upper interconnection balls 230 as described further below in reference to FIGS. 7 and 8.

Further, inactive surface 224 and upper portions 342 of sides 225 of electronic component 220 project from principal surface 454P and generally from package body 454. Stated another way, inactive surface 224 and upper portions 342 of sides 225 of electronic component 220 are exposed from package body 454.

Package body 454 is formed while at the same time exposing inactive surface 224 and upper portions 342 of sides 225 of electronic component 220 in a single encapsulate operation 106. By exposing inactive surface 224 and upper portions 342 of sides 225 of electronic component 220, heat transfer from electronic component 220 directly to the ambient environment is maximized.

Although a film assist mold for formation of package body 454 during encapsulate operation 106 is described above, in other embodiments, package body 454 if formed by spin coating and/or screen printing an encapsulant.

Figure 5:
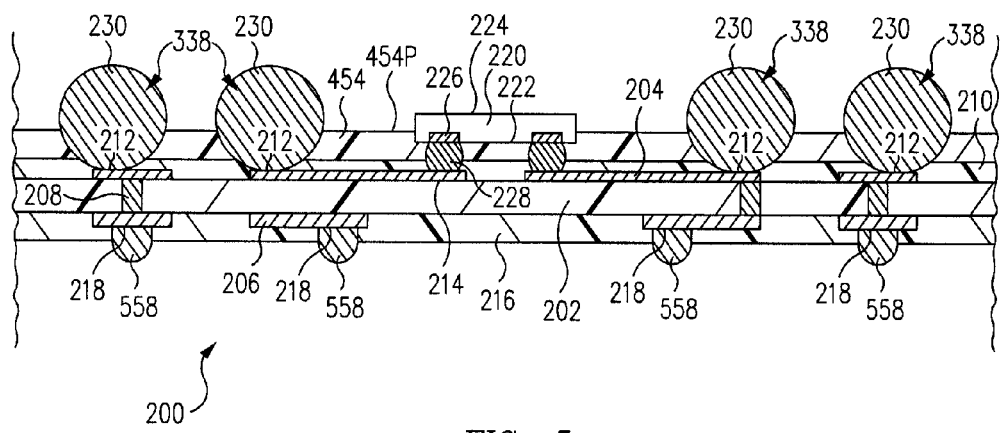
FIGS. 5 and 6 are cross-sectional views of the stackable package of FIG. 4 at later stages during fabrication in accordance with various embodiments.

FIG. 5 is a cross-sectional view of stackable package 200 of FIG. 4 at a later stage during fabrication in accordance with one embodiment. Referring now to FIGS. 1 and 5 together, from encapsulate operation 106, flow moves, optionally, to a clean operation 108. In clean operation 108, the exposed upper portions 338 of upper interconnection balls 230 are cleaned to remove any residue or contamination formed thereon. Illustratively, upper interconnection balls 230 are cleaned by etching although are cleaned using any one of the number of different cleaning techniques, e.g., depending upon the residue or contamination to be removed. By cleaning upper interconnection balls 230, reliability of reflow of upper interconnection balls 230 is increased. However, clean operation 108 is optional, and in one embodiment, is not performed.

From clean operation 108 (or directly from encapsulate operation 106 in the event that optional clean operation 108 is not performed), flow moves to an attach lower interconnection balls operation 110. In attach lower interconnection balls operation 110, lower, e.g., second, interconnection balls 558 are attached to lower traces 206, e.g., terminals 218 thereof, and more generally to substrate 202. Optionally, stackable package 200 is marked, e.g., with a part number or other mark.

Illustratively, lower interconnection balls 558 are formed of solder. In other embodiments, lower interconnection balls 558 are formed of other electrically conductive material such as plated copper or electrically conductive adhesive.

In one embodiment, lower interconnection balls 558 are distributed in an array forming a Ball Grid Array (BGA). Illustratively, lower interconnection balls 558 are used to connect stackable package 200 to other structures such as a larger substrate, e.g., a printed circuit motherboard.

Although attach lower interconnection balls operation 110 is set forth at a particular stage during fabrication of stackable package 200, in other embodiments, attach lower interconnection balls operation 110 is performed at an earlier or later stage during fabrication of stackable package 200.

Figure 6:
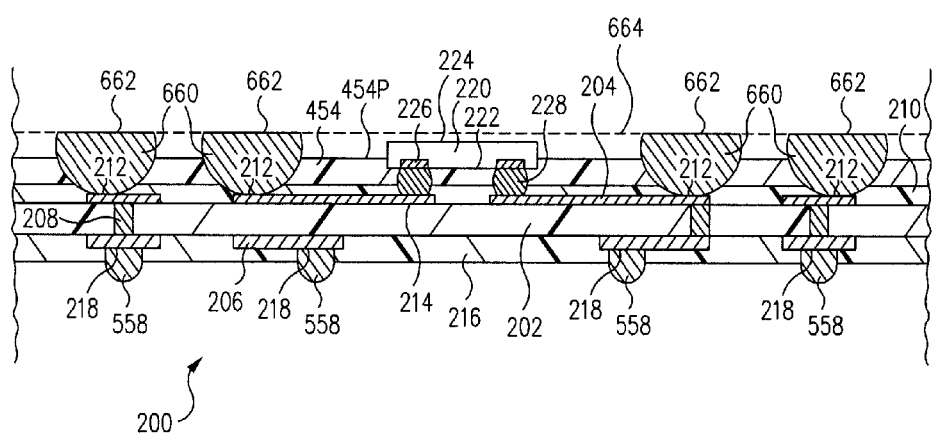

FIG. 6 is a cross-sectional view of stackable package 200 of FIG. 5 at a later stage during fabrication in accordance with one embodiment. Referring now to FIGS. 1, 5, and 6 together, from attach lower interconnection balls operation 110, flow moves, optionally, to a flatten upper interconnection balls operation 112. In flatten upper interconnection balls operation 112, upper interconnection balls 230 (FIG. 5) are flattened to form flattened interconnection balls 660 as illustrated in FIG. 6. More particularly, upper interconnection balls 230 (FIG. 5) are flattened, e.g., with a heated plate, to form flattened interconnection balls 660. Accordingly, flattened interconnection balls 660 include upper, e.g., first, flat surfaces 662.

Flat surfaces 662 are planar surfaces and lie in a planar seating plane 664, i.e., flat surfaces 662 are parallel and coplanar to one another. Flat surfaces 662 are exposed from and above package body 454.

In one embodiment, stackable package 200 is warped, e.g., due to mismatch in stress generated by the various layers such as substrate 202 and package body 454. Stackable package 200 is warped prior to performance of flatten upper interconnection balls operation 112. For example, stackable package 200 is warped at the stage illustrated in FIG. 5. Due to this warpage, upper interconnection balls 230 are not perfectly coplanar at the stage illustrated in FIG. 5.

In accordance with another embodiment, upper interconnection balls 230 are formed with a certain amount of tolerance and thus mismatch. Stated another way, some of upper interconnection balls 230 are larger than others of upper interconnection balls 230. For example, upper interconnection balls 230 vary slightly in size at the stage illustrated in FIG. 5. Due to this variation in size, upper interconnection balls 230 are not perfectly coplanar at the stage illustrated in FIG. 5.

Although warpage and size variation are set forth above as reasons for non-coplanarity of upper interconnection balls 230, in light of this disclosure, those of skill in the art will understand that upper interconnection balls 230 can be non-coplanar for other reasons.

Although non-coplanarity of upper interconnection balls 230 is set forth above in various examples, in another embodiment, upper interconnection balls 230 are coplanar prior to performance of flatten upper interconnection balls operation 112.

However, regardless of whether upper interconnection balls 230 are coplanar or non-coplanar, after performance of flatten upper interconnection balls operation 112, flat surfaces 662 lie in planar seating plane 664. Stated another way, after performance of flatten upper interconnection balls operation 112, flattened interconnection balls 660 provide a planar seating plane 664. By providing planar seating plane 664, bonding with interconnection balls of a stacked electronic component package is enhanced thus maximizing yield as discussed further below. However, flatten upper interconnection balls operation 112 is optional, and in one embodiment, is not performed.

Figure 7:
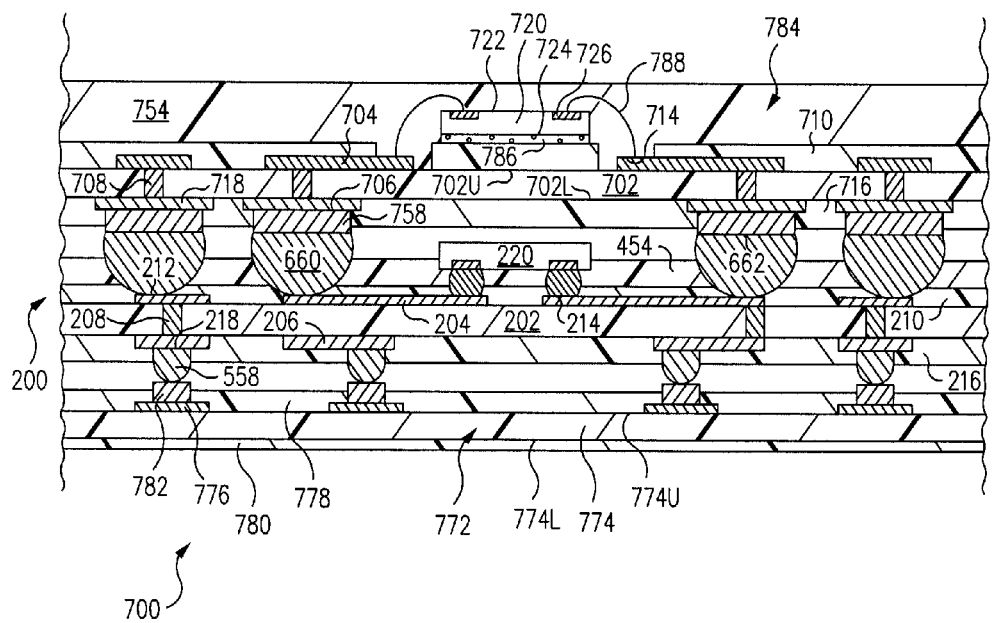
FIG. 7 is a cross-sectional view of an electronic component assembly including the stackable package of FIG. 6 during fabrication in accordance with one embodiment.

FIG. 7 is a cross-sectional view of an electronic component assembly 700 including stackable package 200 of FIG. 6 during fabrication in accordance with one embodiment. Referring now to FIG. 7, stackable package 200, sometimes called a Package-On-Package (POP) base package, is stacked on a larger substrate 772. Larger substrate 772, e.g., a printed circuit motherboard, includes a dielectric substrate 774 having an upper, e.g., first, surface 774U and an opposite lower, e.g., second, surface 774L.

Terminals 776, e.g., of a circuit pattern, are formed on upper surface 774U of substrate 774. Although not illustrated, in light of this disclosure, those of skill in the art will understand that larger substrate 772 can have additional and/or difference circuit patterns depending upon the particular application.

Larger substrate 772 further includes an upper, e.g., first, solder mask 778 on upper surface 774U of substrate 774 and a lower, e.g., second, solder mask 780 on lower surface 774L of substrate 774. Upper solder mask 778 is patterned to expose terminals 776.

Solder structures 782 are formed on terminals 776. Illustratively, solder structures 782 are formed of screen printed solder paste. Lower interconnection balls 558 of stackable package 200 are placed into contact (stacked on) respective solder structures 782.

Further, an upper, e.g., second, electronic component package 784 is stacked upon stackable package 200. Upper electronic component package 784 is sometimes called a stacked electronic component package.

Upper electronic component package 784 includes a substrate 702, an upper surface 702U, a lower surface 702L, upper traces 704, lower traces 706, vias 708, an upper solder mask 710, bond fingers 714, a lower solder mask 716, terminals 718, an electronic component 720, an active surface 722, an inactive surface 724, bond pads 726, a package body 754, and lower interconnection balls 758 (which may be more rounded than pictured) similar to substrate 202, upper surface 202U, lower surface 202L, upper traces 204, lower traces 206, vias 208, upper solder mask 210, bond fingers 214, lower solder mask 216, terminals 218, electronic component 220, active surface 222, inactive surface 224, bond pads 226, package body 454, and lower interconnection balls 558 of stackable package 200, respectively, and so the description thereof is not repeated here.

However, electronic component 720 is mounted in a wirebond configuration in upper electronic component package 784. More particularly, inactive surface 724 is mounted to upper solder mask 710 by an adhesive 786. Further, bond pads 726 are electrically connected to bond fingers 714 by bond wires 788. Bond wires 788 are enclosed in package body 754.

Lower interconnection balls 758 of upper electronic component package 784 are placed upon flat surfaces 662 of flattened interconnection balls 660. As flat surfaces 662 lie in a flat seating plane as discussed above, contact between lower interconnection balls 758 of upper electronic component package 784 and flattened interconnection balls 660 is enhanced thus enhancing bonding therebetween.

In one embodiment, lower interconnection balls 558 and/or lower interconnection balls 758 are flux dipped prior to stacking.

Although a particular upper electronic component package 784 is illustrated and discussed, in light of this disclosure, those of skill in the art will understand that other upper electronic component packages or devices can be stacked on stackable package 200 in other embodiments. For example, an upper electronic component package includes an electronic component mounted in a flip chip configuration and/or multiple electronic components stacked one upon another or side by side.

Figure 8:
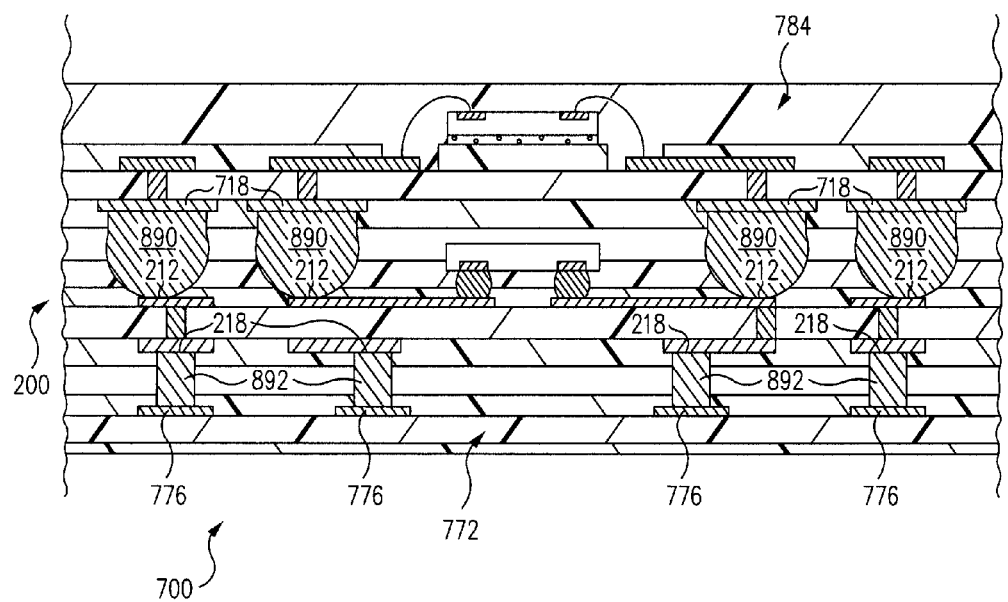
FIG. 8 is a cross-sectional view of the electronic component assembly of FIG. 7 at a later stage during fabrication in accordance with one embodiment.

FIG. 8 is a cross-sectional view of electronic component assembly 700 of FIG. 7 at a later stage during fabrication in accordance with one embodiment. Referring now to FIGS. 7 and 8 together, assembly 700 is heated to reflow, i.e., melt and resolidify, lower interconnection balls 758, flattened interconnection balls 660, lower interconnection balls 558, and solder structures 782.

More particularly, lower interconnection balls 758 and flattened interconnection balls 660, e.g., solder, are heated to melt lower interconnection balls 758 and flattened interconnection balls 660. Upon melting, lower interconnection balls 758 and flattened interconnection balls 660 combine (intermix) into molten structures, e.g., molten solder. These molten structures cool and form solder columns 890. In accordance with this embodiment, solder columns 890 are integral, i.e., are single unitary structures and not a plurality of different layers connected together.

Solder columns 890 extend between lower terminals 718 of upper electronic component package 784 and terminals 212 of stackable package 200. In one example, upper electronic component package 784 is mounted and electrically connected to stackable package 200 by solder columns 890.

Further, during the reflow, lower interconnection balls 558 and solder structures 782, e.g., solder, are heated to melt lower interconnection balls 558 and solder structures 782. Upon melting, lower interconnection balls 558 and solder structures 782 combine (intermix) into molten structures, e.g., molten solder. These molten structures cool and form solder columns 892. In accordance with this embodiment, solder columns 892 are integral, i.e., are single unitary structures and not a plurality of different layers connected together.

Solder columns 892 extend between terminals 218 of stackable package 200 and terminals 776 of larger substrate 772. In one example, stackable package 200 is mounted and electrically connected to larger substrate 772 by solder columns 892.

In the following FIGS. 9, 10, 11, 12, 13, 14, 15, 16, various stackable packages 900, 1000, 1100, 1200, 1300, 1400, 1500, 1600, respectively, are illustrated in accordance with various embodiments. In light of this disclosure, those of skill in the art will understand that stackable packages 900, 1000, 1100, 1200, 1300, 1400, 1500, 1600 are formed using a mold similar or identical to mold 332 including lower compliant surface 346 as discussed above in detail with reference to FIG. 3 in one embodiment.

Figure 9:
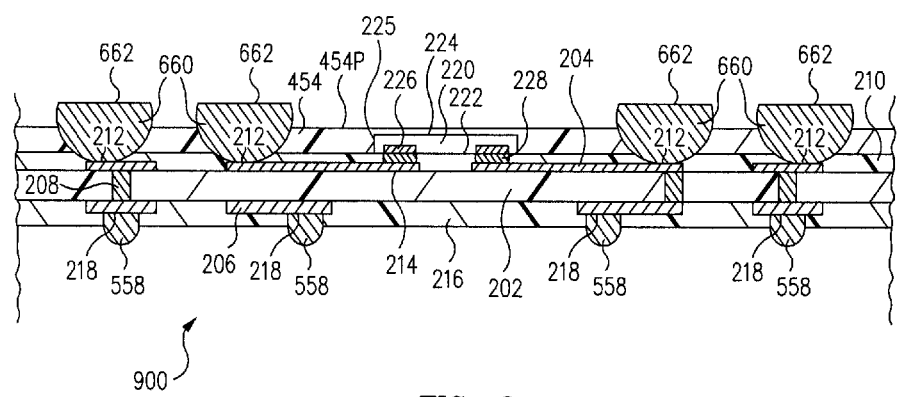
FIGS. 9, 10, 11, 12, 13, 14, 15, 16 are cross-sectional views of stackable packages in accordance with various embodiments.

FIG. 9 is a cross-sectional view of a stackable package 900 in accordance with another embodiment. Stackable package 900 of FIG. 9 is similar to stackable package 200 of FIG. 6 and only the significant differences are discussed below.

Referring now to FIG. 9, in accordance with this embodiment, package body 454 entirely encloses electronic component 220. More particularly, package body 454 directly contacts and encloses sides 225 and inactive surface 224 of electronic component 220. Accordingly, stackable package 900 is sometimes called a fully encapsulated flip chip die package.

Figure 10:
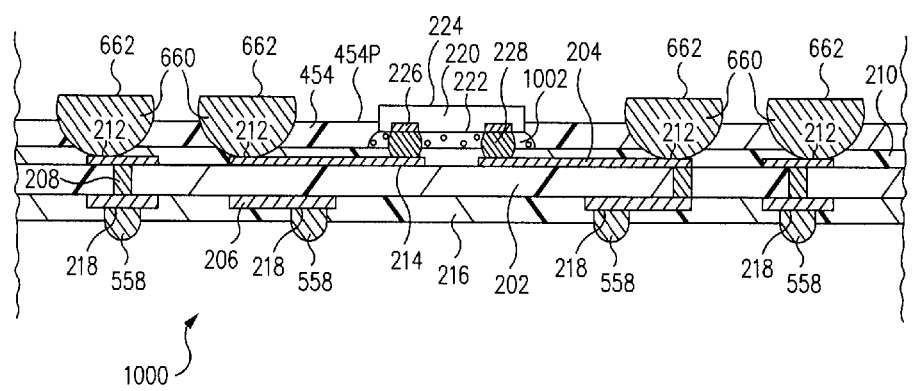

FIG. 10 is a cross-sectional view of a stackable package 1000 in accordance with another embodiment. Stackable package 1000 of FIG. 10 is similar to stackable package 200 of FIG. 6 and only the significant differences are discussed below.

Referring now to FIG. 10, in accordance with this embodiment, an underfill 1002 is applied, e.g., by capillary action, between active surface 222 of electronic component 220 and upper solder mask 210 (or upper surface 202U of substrate 202) and encloses and protects flip chip bumps 228. As illustrated, package body 454 encloses underfill 1002. Stackable package 1000 is sometimes called a capillary underfill flip chip die package.

Figure 11:
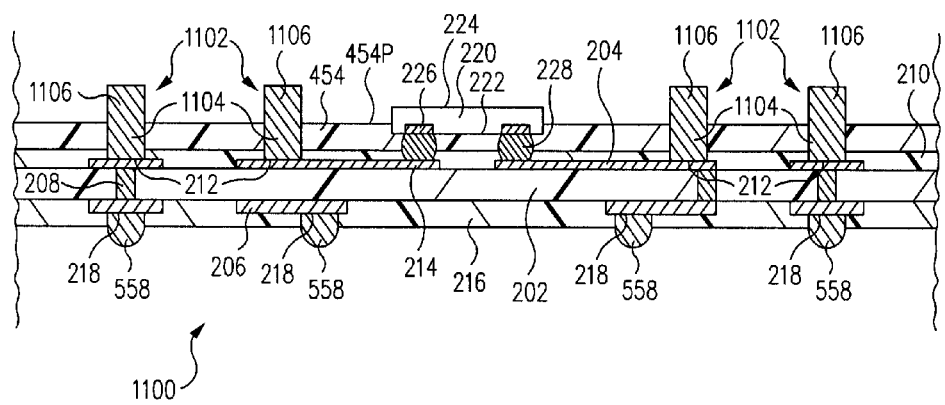

FIG. 11 is a cross-sectional view of a stackable package 1100 in accordance with another embodiment. Stackable package 1100 of FIG. 11 is similar to stackable package 200 of FIG. 6 and only the significant differences are discussed below.

Referring now to FIG. 11, in accordance with this embodiment, electrically conductive columns 1102 are formed on terminals 212 of upper traces 204. Illustratively, columns 1102 are formed of solder, i.e., are solder columns, although are formed of other electrically conductive materials in other embodiments. Columns 1102 are sometimes called interconnection structures.

Columns 1102 are cylindrical in this embodiment. Columns 1102 include lower, e.g., first, portions 1104 that are enclosed within package body 454. Columns 1102 further include upper, e.g., second, portions 1106 that protrude above and are exposed from package body 454. Stackable package 1100 is sometimes called a column package.

Figure 12:
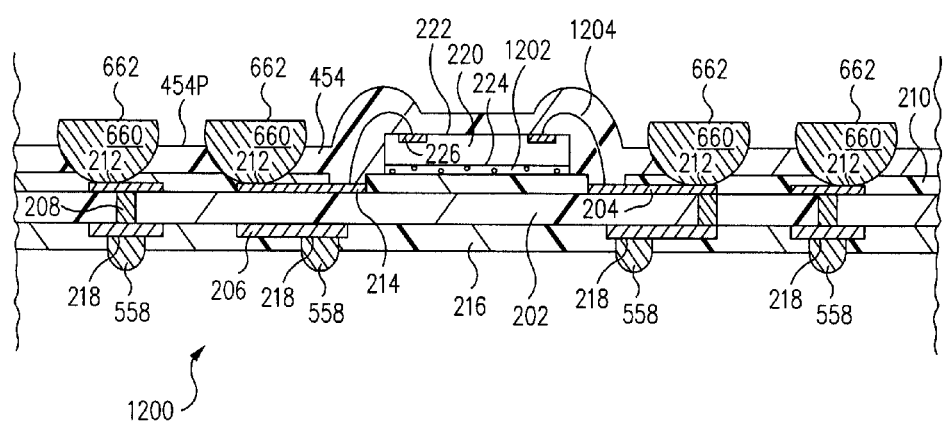

FIG. 12 is a cross-sectional view of a stackable package 1200 in accordance with another embodiment. Stackable package 1200 of FIG. 12 is substantially similar to stackable package 200 of FIG. 6 and only the significant differences are discussed below.

Referring now to FIG. 12, in accordance with this embodiment, electronic component 220 is mounted in a wirebond configuration. More particularly, inactive surface 224 is mounted to upper solder mask 210 (or directly to upper surface 202U of substrate 202) by an adhesive 1202. Further, bond pads 226 are electrically connected to bond fingers 214 by bond wires 1204. Bond wires 1204 are enclosed in package body 454.

In one embodiment, bond wires 1204 are coated with an insulator to protect bond wires 1204. For example, referring to FIGS. 1, 3, and 12 together, during encapsulate operation 106, lower compliant surface 346 of upper mold half 334 is pressed against bond wires 1204. Accordingly, package body 454 may or may not entirely cover bond wires 1204. In the event that a portion of bond wires 1204 are exposed from package body 454, the exposed portion is coated with an insulator and thus protected, e.g., from shorting. Stackable package 1200 is sometimes called a wire bonded die package.

Figure 13:
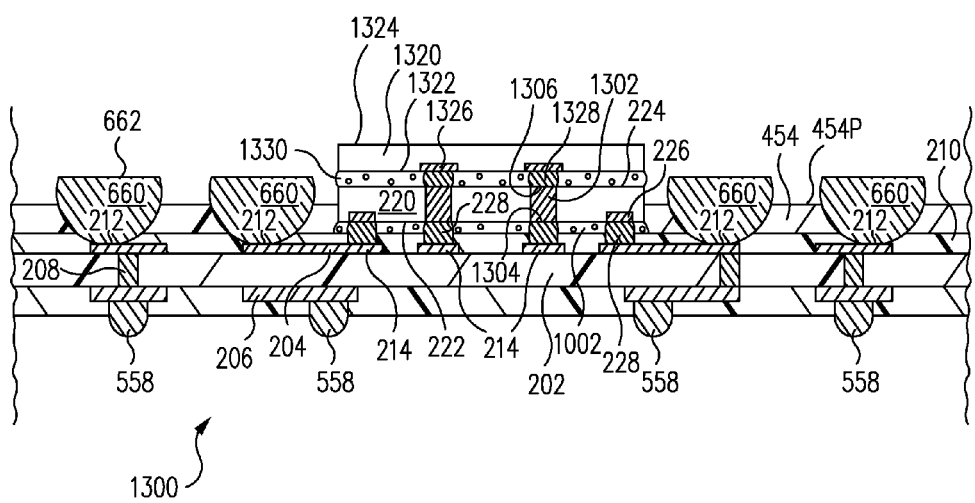

FIG. 13 is a cross-sectional view of a stackable package 1300 in accordance with another embodiment. Stackable package 1300 of FIG. 13 is substantially similar to stackable package 200 of FIG. 6 and only the significant differences are discussed below.

Referring now to FIG. 13, in accordance with this embodiment, electrically conductive through electronic component vias 1302 are formed through electronic component 220, sometimes called a first or lower electronic component.

More particularly, through electronic component vias 1302 extend between active surface 222 and inactive surface 224. The ends of through electronic component vias 1302 at active surface 222 define active surface through via terminals 1304. Further, the ends of through electronic component vias 1302 at inactive surface 224 define inactive surface through via terminals 1306. Active surface through via terminals 1304 are electrically connected to inactive surface through via terminals 1306 by through electronic component vias 1302.

In accordance with this embodiment, active surface through via terminals 1304 are physically and electrically connected to bond fingers 214 of upper traces 204 by flip chip bumps 228. Further, in accordance with this embodiment, stackable package 1300 includes underfill 1002 similar or identical to underfill 1002 as described above in reference to FIG. 10.

Stackable package 1300 further includes an upper, e.g., second, electronic component 1320. In one embodiment, upper electronic component 1320 is an integrated circuit chip, e.g., an active component. However, in other embodiments, upper electronic component 1320 is a passive component such as a capacitor, resistor, or inductor. In another embodiment, upper electronic component 1320 is a pre-packaged device. In yet another embodiment, a plurality of electronic components are mounted, e.g., in a stacked configuration.

In accordance with this embodiment, upper electronic component 1320 includes an active surface 1322 and an opposite inactive surface 1324. Upper electronic component 1320 further includes bond pads 1326 formed on active surface 1322.

In accordance with this embodiment, upper electronic component 1320 is mounted in a flip chip configuration to inactive surface through via terminals 1306. More particularly, flip chip bumps 1328, e.g., solder, form the physical and electrical connections between bond pads 1326 and inactive surface through via terminals 1306. Further, an underfill 1330 is applied between active surface 1322 of upper electronic component 1320 and inactive surface 224 of lower electronic component 220 and encloses and protects flip chip bumps 1328. Stackable package 1300 is sometimes called a stacked flip chip die using through silicon vias package.

Figure 14:
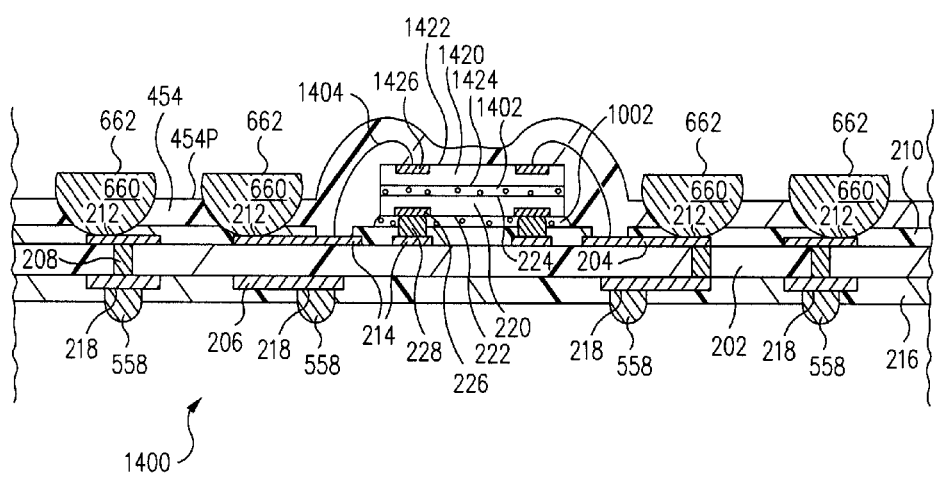

FIG. 14 is a cross-sectional view of a stackable package 1400 in accordance with another embodiment. Stackable package 1400 of FIG. 14 is similar to stackable package 200 of FIG. 6 and only the significant differences are discussed below.

Referring now to FIG. 14, in accordance with this embodiment, stackable package 1400 further includes an upper, e.g., second, electronic component 1420. In one embodiment, upper electronic component 1420 is an integrated circuit chip, e.g., an active component. However, in other embodiments, upper electronic component 1420 is a passive component such as a capacitor, resistor, or inductor. In another embodiment, upper electronic component 1420 is a pre-packaged device. In yet another embodiment, a plurality of electronic components are mounted, e.g., in a stacked configuration.

In accordance with this embodiment, upper electronic component 1420 includes an active surface 1422 and an opposite inactive surface 1424. Upper electronic component 1420 further includes bond pads 1426 formed on active surface 1422.

Upper electronic component 1420 is mounted in a wirebond configuration. More particularly, inactive surface 1424 of upper electronic component 1420 is mounted to inactive surface 224 of lower electronic component 220 by an adhesive 1402. Further, bond pads 1426 are electrically connected to bond fingers 214 by bond wires 1404. Bond wires 1404 are enclosed in package body 454.

In one embodiment, bond wires 1404 are coated with an insulator to protect bond wires 1404. For example, referring to FIGS. 1, 3, and 14 together, during encapsulate operation 106, lower compliant surface 346 of upper mold half 334 is pressed against bond wires 1404. Accordingly, package body 454 may or may not entirely cover bond wires 1404. In the event that a portion of bond wires 1404 are exposed from package body 454, the exposed portion is coated with an insulator and thus protected, e.g., from shorting.

Further, in accordance with this embodiment, stackable package 1400 includes underfill 1002 similar or identical to underfill 1002 as described above in reference to FIG. 10. Stackable package 1400 is sometimes called a hybrid stacked die package.

Figure 15:
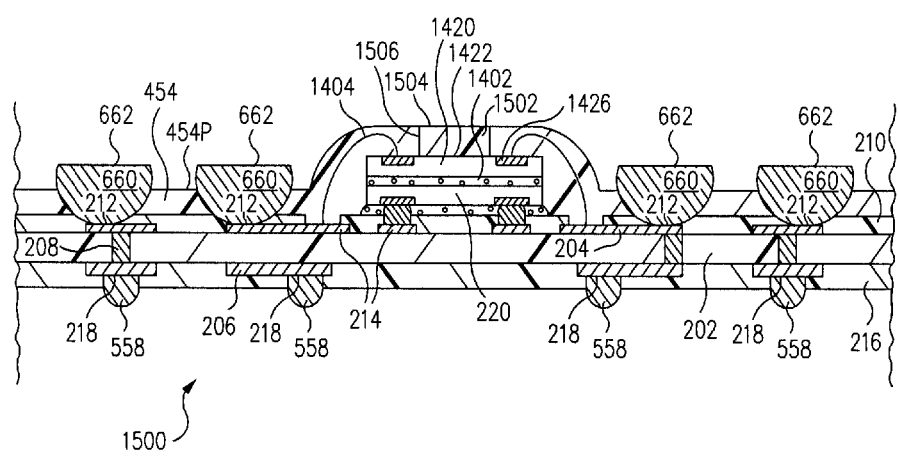

FIG. 15 is a cross-sectional view of a stackable package 1500 in accordance with another embodiment. Stackable package 1500 of FIG. 15 is similar to stackable package 1400 of FIG. 14 and only the significant differences are discussed below.

Referring now to FIG. 15, in accordance with this embodiment, a spacer 1502 is mounted to active surface 1422 of upper electronic component 1420. Spacer 1502 is mounted to active surface 1422 inward of bond pads 1426 of upper electronic component 1420.

In one embodiment, spacer 1502 is adhesive, or includes a lower adhesive surface, such that spacer 1502 adheres to active surface 1422. In another embodiment, spacer 1502 is mounted to active surface 1422 by an adhesive.

In one embodiment, spacer 1502 functions to form package body 454 thicker above bond wires 1404. For example, referring to FIGS. 1, 3, and 15 together, during encapsulate operation 106, lower compliant surface 346 of upper mold half 334 is pressed against spacer 1502 and spaced above bond wires 1404. Accordingly, package body 454 entirely covers bond wires 1404 in accordance with this embodiment.

As illustrated, an upper surface 1504 of spacer 1502 (and sometimes a portion of sides 1506 of spacer 1502) is exposed from package body 454. Stackable package 1500 is sometimes called a hybrid stacked die with spacer package.

Figure 16:
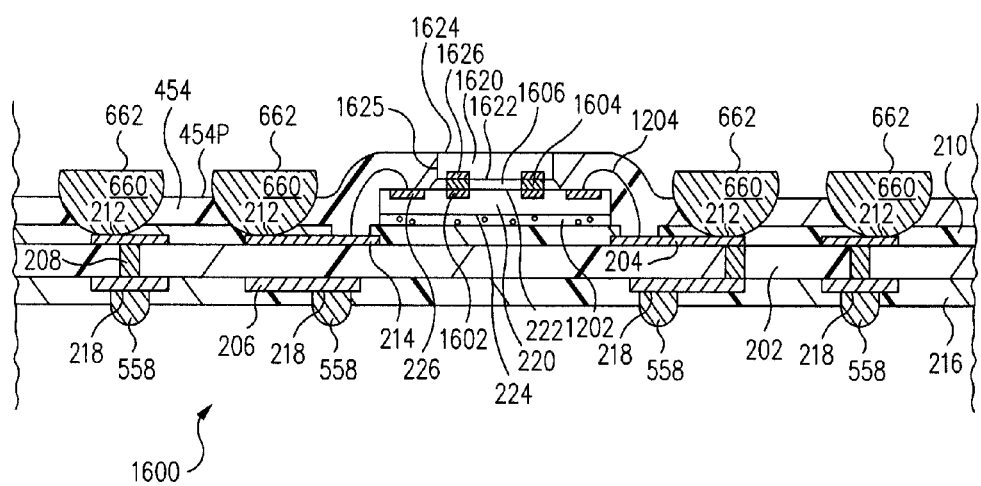

FIG. 16 is a cross-sectional view of a stackable package 1600 in accordance with another embodiment. Stackable package 1600 of FIG. 16 is similar to stackable package 1200 of FIG. 12 and only the significant differences are discussed below.

Referring now to FIG. 16, in accordance with this embodiment, stackable package 1600 further includes an upper, e.g., second, electronic component 1620. In one embodiment, upper electronic component 1620 is an integrated circuit chip, e.g., an active component. However, in other embodiments, upper electronic component 1620 is a passive component such as a capacitor, resistor, or inductor. In another embodiment, upper electronic component 1620 is a pre-packaged device. In yet another embodiment, a plurality of electronic components are mounted, e.g., in a stacked configuration.

In accordance with this embodiment, upper electronic component 1620 includes an active surface 1622 and an opposite inactive surface 1624. Upper electronic component 1620 further includes bond pads 1626 formed on active surface 1622.

Upper electronic component 1620 is mounted in a face-to-face configuration. More particularly, lower electronic component 220 includes upper electronic component terminals 1602 formed on active surface 222. Bond pads 1626 of upper electronic component 1620 are physically and electrically connected to upper electronic component terminals 1602 of lower electronic component 220 by flip chip bumps 1604.

An underfill 1606 is applied between active surface 222 of lower electronic component 220 and active surface 1622 of upper electronic component 1620 and encloses and protects flip chip bumps 1604.

As illustrated, inactive surface 1624 of upper electronic component 1620 (and sometimes a portion of sides 1625 of upper electronic component 1620) is exposed from package body 454. Stackable package 1600 is sometimes called a hybrid stacked die face-to-face package.

Figure 17:
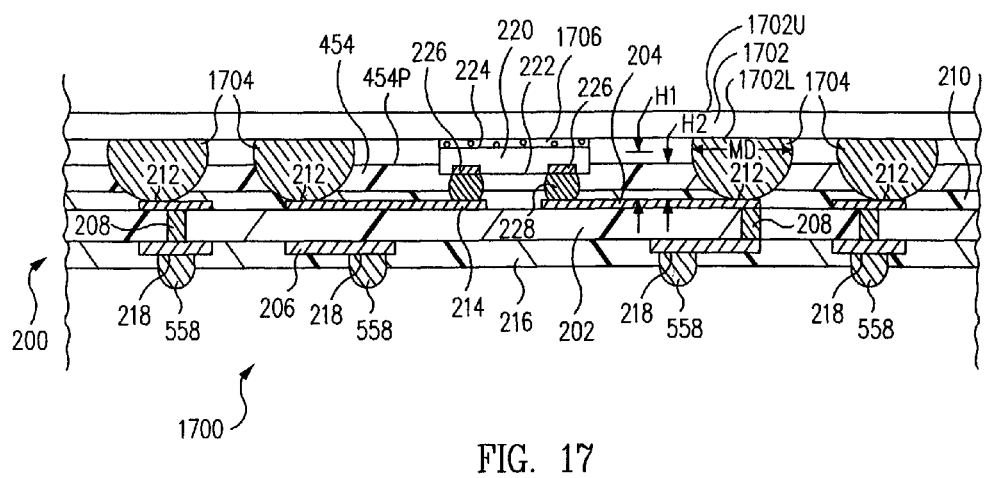
FIG. 17 is a cross-sectional view of a molded underfill flip chip die with heat spreader package in accordance with one embodiment.

FIG. 17 is a cross-sectional view of a molded underfill flip chip die with heat spreader package 1700 in accordance with one embodiment. Molded underfill flip chip die with heat spreader package 1700 of FIG. 17 is similar to stackable package 200 of FIG. 6 and only the significant differences are discussed below.

More particularly, referring to FIGS. 6 and 17 together, molded underfill flip chip die with heat spreader package 1700 is formed by mounting a heat spreader 1702 to stackable package 200 of FIG. 6. In accordance with this embodiment, heat spreader 1702 is both a thermally and electrically conductive material, e.g., is copper, a metal containing material, or other thermally and electrically conductive material.

As illustrated in FIG. 17, heat spreader 1702 includes an upper, e.g., first, surface 1702U and an opposite lower, e.g., second, surface 1702L. Lower surface 1702L of heat spreader 1702 is physically and electrically connected to solder columns 1704.

Solder columns 1704 extend through package body 454 and between lower surface 1702L of heat spreader 1702 and terminals 212. In one example, heat spreader 1702 is mounted and electrically connected to stackable package 200 by solder columns 1704.

Further, in accordance with this embodiment, inactive surface 224 of electronic component 220 is coupled to lower surface 1702L of heat spreader 1702 by a thermal interface material 1706. Illustratively, thermal interface material 1706 is a thermal grease, adhesive, or other material having a relatively high thermal conductivity to thermally couple electronic component 220 to heat spreader 1702.

Further, in one embodiment, thermal interface material 1706 is electrically conductive, e.g., is an electrically conductive adhesive or other electrically conductive material. In accordance with this embodiment, thermal interface material 1706 both thermally and electrically connects inactive surface 224 of electronic component 220 to heat spreader 1702.

In yet another example, thermal interface material 1706 is a dielectric material. In accordance with this embodiment, thermal interface material 1706 electrically insulates inactive surface 224 of electronic component 220 from heat spreader 1702 while at the same time thermally connects inactive surface 224 of electronic component 220 to heat spreader 1702.

In yet another embodiment, thermal interface material 1706 is not used. Accordingly, heat spreader 1702 directly contacts or is spaced apart from inactive surface 224 of electronic component 220.

In one embodiment, to form molded underfill flip chip die with heat spreader package 1700, optionally, thermal interface material 1706 is applied to inactive surface 224 of electronic component 220 and/or the corresponding region of lower surface 1702L of heat spreader 1702. Heat spreader 1702 is placed on flattened interconnection balls 660 (see FIG. 6). Flattened interconnection balls 660, e.g., solder, are reflowed to form solder columns 1704 thus mounting heat spreader 1702 to stackable package 200 of FIG. 6.

In one embodiment, flattened interconnection balls 660 do not deform during reflow to any significant extent. Accordingly, solder columns 1704 are essentially the same shape as flattened interconnection balls 660 prior to reflow. Thus, height H2 of principal surface 454P from terminals 212 of upper traces 204 is less than height H1 of maximum diameter MD of solder columns 1704 from terminals 212 of upper traces 204. However, in other examples, flattened interconnection balls 660 do significantly collapse during reflow such that the resulting shape of solder columns 1704 is different than the shape of flattened interconnection balls 660 prior to reflow.

In one embodiment, heat spreader 1702 is electrically connected to a reference voltage source, e.g., ground. For example, one or more respective lower interconnection balls 558 coupled to heat spreader 1702 are connected to a reference voltage source, e.g., ground. Accordingly, heat spreader 1702 provides thermal management and/or ground management of molded underfill flip chip die with heat spreader package 1700.

Of course, one or more of bond pads 226 of electronic component 220 are not electrically connected to, i.e., are electrically isolated from, heat spreader 1702. To illustrate, the bond pad 226 at the right in the view of FIG. 17 is not electrically connected to, i.e., is electrically isolated from, heat spreader 1702 and is electrically connected to a respective lower interconnection ball 558.

Although mounting of heat spreader 1702 to stackable package 200 of FIG. 6 is discussed above in reference to molded underfill flip chip die with heat spreader package 1700, in other embodiments, heat spreader 1702 is mounted to stackable packages 200, 900, 1000, 1100, 1200, 1300, 1400, 1500, 1600 of FIGS. 5, 9, 10, 11, 12, 13, 14, 15, 16, respectively, in a similar manner.

Figure 18:
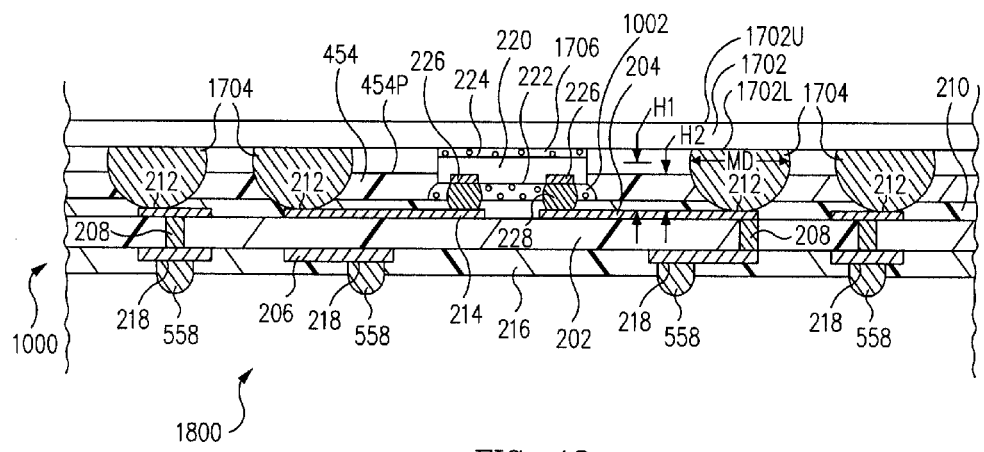
FIG. 18 is a cross-sectional view of a capillary underfill flip chip die with heat spreader package in accordance with another embodiment.

For example, FIG. 18 is a cross-sectional view of a capillary underfill flip chip die with heat spreader package 1800 in accordance with another embodiment. Capillary underfill flip chip die with heat spreader package 1800 is formed by mounting heat spreader 1702 of FIG. 17 to stackable package 1000 of FIG. 10 in a manner similar to that discussed above regarding mounting of heat spreader 1702 of FIG. 17 to stackable package 200 of FIG. 6.

Although specific embodiments were described herein, the scope of the invention is not limited to those specific embodiments. Numerous variations, whether explicitly given in the specification or not, such as differences in structure, dimension, and use of material, are possible. The scope of the invention is at least as broad as given by the following claims.

What is claimed is:

1. A structure comprising:
a substrate comprising a first surface;
terminals coupled to the first surface of the substrate;
an electronic component comprising bond pads;
flip chip bumps coupling the bond pads to bond fingers coupled to the first surface of the substrate;
a heat spreader attached to an inactive surface of the electronic component;
a package body coupled to the substrate; and
solder columns extending through the package body and from the terminals to a lower surface of the heat spreader, wherein the lower surface of the heat spreader is physically and electrically connected to flat surfaces of the solder columns, wherein the solder columns have a maximum diameter in a plane parallel to the first surface of the substrate at a first height from the terminals, and wherein the package body has a principal surface at a second height from the terminals, the second height being less than the first height.

2. The structure of claim 1 further comprising a thermal interface material between the heat spreader and the inactive surface of the electronic component.

3. The structure of claim 1 wherein the package body encloses an active surface of the electronic component and the flip chip bumps.

4. The structure of claim 1 further comprising an underfill enclosing an active surface of the electronic component and the flip chip bumps.

* * * * *